United States Patent
Sakaguchi et al.

(10) Patent No.: US 7,854,367 B2
(45) Date of Patent: Dec. 21, 2010

(54) APPARATUS AND METHOD FOR ARRANGING MAGNETIC SOLDER BALLS

(75) Inventors: Hideaki Sakaguchi, Nagano (JP); Kiyoaki Iida, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 0 days.

(21) Appl. No.: 12/833,191

(22) Filed: Jul. 9, 2010

(65) Prior Publication Data

US 2010/0270364 A1    Oct. 28, 2010

Related U.S. Application Data

(62) Division of application No. 12/178,102, filed on Jul. 23, 2008.

(30) Foreign Application Priority Data

Jul. 25, 2007    (JP)    ............... 2007-193643

(51) Int. Cl.
*B23K 31/02*    (2006.01)

(52) U.S. Cl. ............... 228/180.22; 228/248.1; 228/245; 228/223; 438/612; 438/613; 118/213

(58) Field of Classification Search ............ 228/180.22, 228/248.1, 245, 223; 438/612, 613; 118/213
See application file for complete search history.

(56) References Cited

FOREIGN PATENT DOCUMENTS

| JP | 07-283521 | 10/1995 |
|----|-----------|---------|
| JP | 2004-311886 | 11/2004 |
| JP | 2006-005276 | 1/2006 |
| JP | 2007-125794 | 5/2007 |

*Primary Examiner*—Kiley Stoner
*Assistant Examiner*—Erin B Saad
(74) *Attorney, Agent, or Firm*—Drinker Biddle & Reath LLP

(57) ABSTRACT

An apparatus for arranging magnetic solder balls includes: a stage for placing and fixing the substrate thereon; a magnet which is incorporated in the stage and is movable in parallel with a lower surface of the placed and fixed substrate so as to cause a magnetic force to act in an upward direction of the stage; and a mask frame capable of being positioned above the stage. An arranging method using this arranging apparatus is also provided. An apparatus for arranging magnetic solder balls includes: a stage for placing and fixing the substrate thereon; a mask frame capable of being positioned above the stage; and a magnetic generator which is movable above the mask frame and causes a magnetic force to act on the stage. An arranging method using this arranging apparatus is also provided.

1 Claim, 4 Drawing Sheets

APPARATUS AND METHOD FOR ARRANGING MAGNETIC SOLDER BALLS

This is a divisional application of copending application Ser. No. 12/178,102, filed on Jul. 23, 2008, which is incorporated by reference herein in its entirety.

BACKGROUND OF THE INVENTION

The present invention relates to an apparatus and a method for arranging magnetic solder balls one each on each of a plurality of bonding pads on a substrate through a mask.

Conventionally, solder paste is screen printed to form solder bumps on bonding pads for flip chip bonding of a substrate such as a wafer or a circuit substrate. However, in conjunction with the trend toward the higher density of semiconductor devices, the bump pitch is required to be infinitesimally small such as on the order of 200 μm or even 150 μm. If solder paste is screen printed at such an infinitesimally small pitch, attachment of the solder paste on a bridge between bumps and on a screen mask occurs. For this reason, the formation of the solder bumps at the infinitesimally small pitch cannot be effected by screen printing.

Accordingly, as a method of forming bumps at an infinitesimally small pitch, it is conceivable to arrange the solder balls on the bonding pads.

As one method which is conventionally carried out for bonding pads for board mounting on the outer side of a ball grid array (BGA), a method is known in which solder balls are sucked by a sucking jig and are transported so as to be mounted on the bonding pads. Adhesive soldering flux is coated in advance on the bonding pads, to thereby allow the solder balls to adhere to and fixed to the bonding pads. In this case, however, the diameter of the solder balls is large in the vicinities of 0.5 to 0.7 mm. In contrast, the diameter of the solder balls for the infinitesimally small pitch needs to be set to 100 μm or below. When the solder balls thus become infinitesimally small, there arise problems that the solder balls coagulate due to the action of static electric charge, and that the solder balls cannot be disposed at accurate positions owing to the effect of air flow. In addition, suction ports of the suction jig are also miniaturized, so that the processing cost becomes high, which is not suitable for practical use.

For this reason, a method in which the solder balls are dropped into openings of the mask placed on the substrate (a so-called "dropping method") is carried out as another method. After the application of flux to the bonding pads on the substrate, the pads and the metal mask are positioned and superposed on top of each other. In that state, the solder balls are dropped from above the metal mask, and the solder balls are dropped into the openings of the metal mask. The solder balls are dropped from a container having an opening such as a slit, and it is ensured that an appropriate amount is dropped onto the mask. One ball is dropped into each opening of the mask, is placed on the bonding pad positioned with respect to the opening, and is adhered and fixed by adhesive flux applied to the bonding pad. The solder balls remaining on the mask are collected by a collecting mechanism.

Here, a means for reliably dropping the solder balls into the mask openings should preferably be provided. Patent document 1 discloses a method in which, by using a flexible spatula or brush as a dropping means, the solder balls are mechanically moved forcibly on the mask to drop the solder balls into the mask openings.

However, if the mechanical forcible movement by means of the spatula or the brush is carried out, there arise problems in that damage or deformation can occur in the solder balls owing to the spatula or the brush, and that foreign matter can be mixed in from the brush.

In recent years, cored solder balls such as Cu-cored solder balls and resin-cored solder balls have been used. The cored solder ball has a structure in which a solder layer is provided on the surface of a Cu or resin core, and a diffusion barrier layer is interposed between the core and the solder layer so that the solder in the surface layer is not diffused into the core under a high temperature during flip chip bonding. Here, the diffusion barrier layer is formed of a ferromagnetic material such as Ni.

This cored solder ball has outstanding advantages in that even if the solder is fused at the time of flip chip bonding, the Cu or resin core keeps its original shape and functions as a spacer for keeping a constant interval between an electronic part such as a semiconductor device and a mounting substrate and prevents faulty connection due to the cracking or deformation of the solder bump caused by high-temperature degradation.

However, if the mechanical forcible movement by means of the spatula or the brush is carried out, damage, deformation, and comingling of foreign matter due to it can occur, so that there has been a problem that full use cannot be made of the outstanding advantages of the cored solder balls.

[Patent Document 1] JP-A-2004-311886

SUMMARY OF THE INVENTION

An object of the invention is to provide an apparatus and a method for arranging magnetic solder balls, which make it possible to dispose on bonding pads of a substrate infinitesimally small solder balls, particularly magnetic cored solder balls, without causing damage to, deformation of, and comingling of foreign matter with, the solder balls, which have been unavoidable with a conventional dropping means.

(First Invention)

To attain the above object, according to a first aspect of the invention, there is provided an apparatus for arranging magnetic solder balls one each on each of a plurality of bonding pads on a substrate through a mask, including:

a stage for placing and fixing the substrate thereon;

a magnet which is incorporated in the stage and is movable in parallel with a lower surface of the placed and fixed substrate so as to cause a magnetic force to act in an upward direction of the stage; and a mask frame capable of being positioned above the stage.

Further, according to a second aspect of the invention, there is provided a method for arranging magnetic solder balls one each on each of a plurality of bonding pads on a substrate through a mask by using the apparatus according to the first aspect, including the steps of:

placing and fixing on the stage the substrate with adhesive flux coated on the bonding pads;

causing the mask frame, to which the mask having openings corresponding to positions of the bonding pads of the substrate is affixed, to be disposed on the substrate with a predetermined, interval provided between the mask and the substrate, such that the bonding pads and the openings are positioned with respect to each other;

dispersing the magnetic solder balls on the mask; and moving the magnet in the stage in parallel with the lower surface of the substrate to cause the magnetic solder balls dispersed on the mask to move on the mask by the action of a magnetic force from the magnet, to drop the magnetic solder balls into the openings of the mask so that the magnetic solder balls are mounted on the bonding pads located below the openings.

(Second Invention)

Further, according to a third aspect of the invention, there is provided an apparatus for arranging magnetic solder balls one each on each of a plurality of bonding pads on a substrate through a mask, including:

a stage for placing and fixing the substrate thereon;

a mask frame capable of being positioned above the stage; and a magnetic generator which is movable above the mask frame and causes a magnetic force to act on the stage.

Further, according to a forth aspect of the invention, there is provided the apparatus for arranging magnetic solder balls according to the third aspect, further including:

a bulkhead formed of a ferromagnetic material and disposed between the mask frame and the magnetic generator formed of a permanent magnet.

Further, according to a fifth aspect of the invention, there is provided a method for arranging magnetic solder balls one each on each of a plurality of bonding pads on a substrate through a mask by using the apparatus according to the third or forth aspect, including the steps of:

placing and fixing on the stage the substrate with adhesive flux coated on the bonding pads;

causing the mask frame, to which the mask having openings corresponding to positions of the bonding pads of the substrate is affixed, to be disposed on the substrate with a predetermined interval provided between the mask and the substrate, such that the bonding pads and the openings are positioned with respect to each other; and causing the magnetic generator which attracts the magnetic solder balls by the magnetic force to be stopped above a predetermined solder-ball arrangement area of the substrate, and stopping the attracting operation of the magnetic generator, so as to disperse the magnetic solder balls on the mask, to drop the solder balls into the openings of the mask so that the solder balls are mounted on the bonding pads located below the openings.

According to the first invention of the invention, the magnet incorporated in the stage with the substrate placed and fixed thereon is used as a dropping means, and the magnetic solder balls are moved on the mask by moving the magnet below the stage while a magnetic force is being applied to the magnetic solder balls on the mask located above the stage, thereby dropping the magnetic solder balls into the openings of the mask so as to mount the magnetic solder balls on the bonding pads located below the openings. Therefore, the magnetic solder balls can be dropped in a mechanically non-contacting state. Hence, it is possible to prevent the occurrence of the damage to, deformation of, and comingling of foreign matter with, the solder balls, which unavoidably occurred in the dropping based on the mechanical contact using a conventional spatula or brush as the dropping means.

According to the second invention of the invention, the magnetic generator which attracted the magnetic solder balls by the magnetic force is stopped above a predetermined solder-ball arrangement area of the substrate, and the attracting operation of the magnetic generator is stopped, so as to disperse the magnetic solder balls on the mask, thereby dropping the solder balls into the openings of the mask and mounting the solder balls on the bonding pads located below the openings. Therefore, the magnetic solder balls can be dropped in a mechanically non-contacting state. Hence, it is possible to prevent the occurrence of the damage to, deformation of, and comingling of foreign matter with, the solder balls, which unavoidably occurred in the dropping based on the mechanical contact using a conventional spatula or brush as the dropping means.

DETAILED DESCRIPTION OF THE PREFERRED EMBODIMENTS

First Embodiment

Figure 1A:
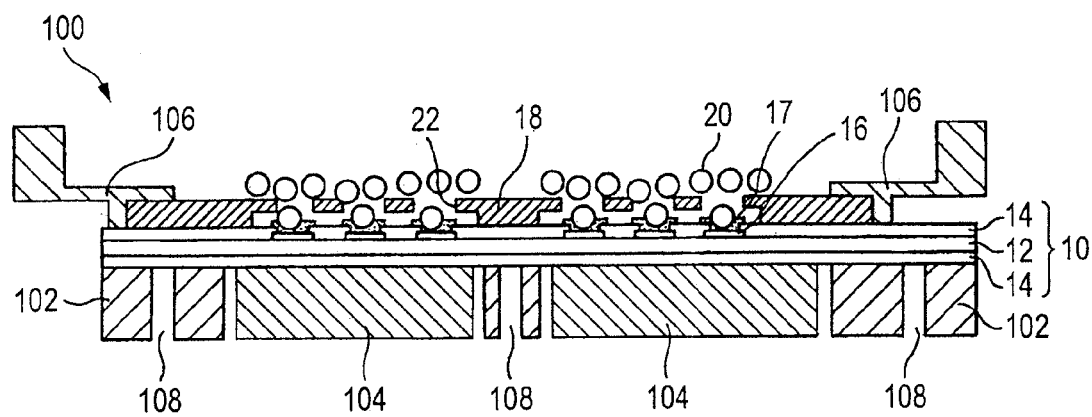
FIG. 1A is a cross-sectional view illustrating an apparatus for arranging magnetic solder balls in accordance with a first embodiment of the invention.
Figure 1B:
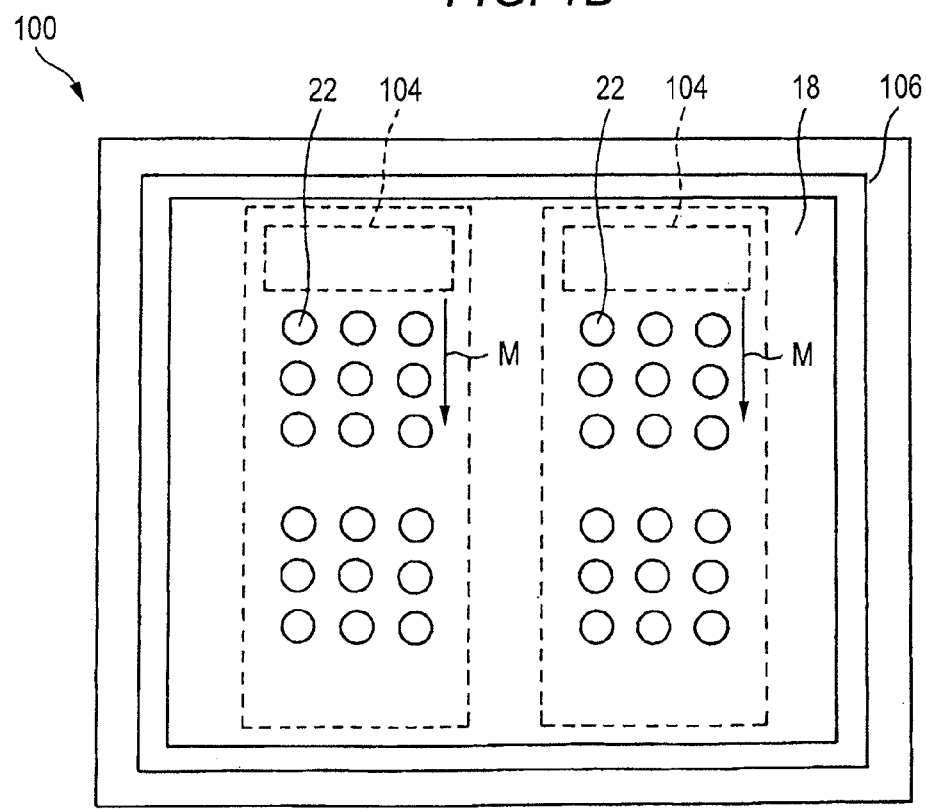
FIG. 1B is a plan view of the apparatus for arranging magnetic solder balls in accordance with the first embodiment of the invention.

Referring to FIGS. 1A and 1B, a description will be given of an apparatus for arranging magnetic solder balls in accordance with the invention. FIG. 1A is a cross-sectional view, and FIG. 1B is a plan view.

An arranging apparatus 100 is comprised of a stage 102 for placing and fixing a substrate 10 thereon; magnets 104 which are incorporated in the stage 102 and are movable in parallel with the lower surface of the placed and fixed substrate 10 so as to cause a magnetic force to act in the upward direction of the stage 102; and a mask frame 106 capable of being positioned above the stage 102. The arranging apparatus 100 is an apparatus for arranging magnetic solder balls 20 one each on each of a plurality of bonding pads 16 on the substrate 10 through a mask 18.

The substrate 10 is a multilayered circuit board in which a wiring layer and an insulating layer are laminated on both surfaces of a resin-made core substrate having through holes and the like by means of the build-up process or the like. A solder resist layer 14 is formed on each of both upper and lower surfaces of a multilayered circuit portion 12, and the multiplicity of bonding pads 16 arranged on an upper surface of the multilayered circuit portion 12 are exposed in openings of the solder resist layer 14.

It should be noted that although, for the convenience of description, a description will be given of the case where the bonding pads 16 are arranged only on one surface of the substrate 10, also in the case where the bonding pads 16 are arranged on both surfaces of the substrate 10 it suffices if each operation described below is carried out for the both surfaces in a similar manner.

A description will be given below of a method of arranging the magnetic solder balls by using the arranging apparatus 100.

The substrate 10 with adhesive flux 17 coated on the bonding pads 16 is placed and fixed on the stage 102. The stage 102 sucks and fixes the substrate 10 by air suction from suction ports 108.

The mask frame 106, to which the mask 18 having openings 22 corresponding to the positions of the bonding pads 16 of the substrate 10 is affixed, is disposed and made stationary on the substrate 10 with a predetermined interval provided between the mask 18 and the substrate 10, such that the bonding pads 16 and the openings are positioned with respect to each other.

Figure 2:
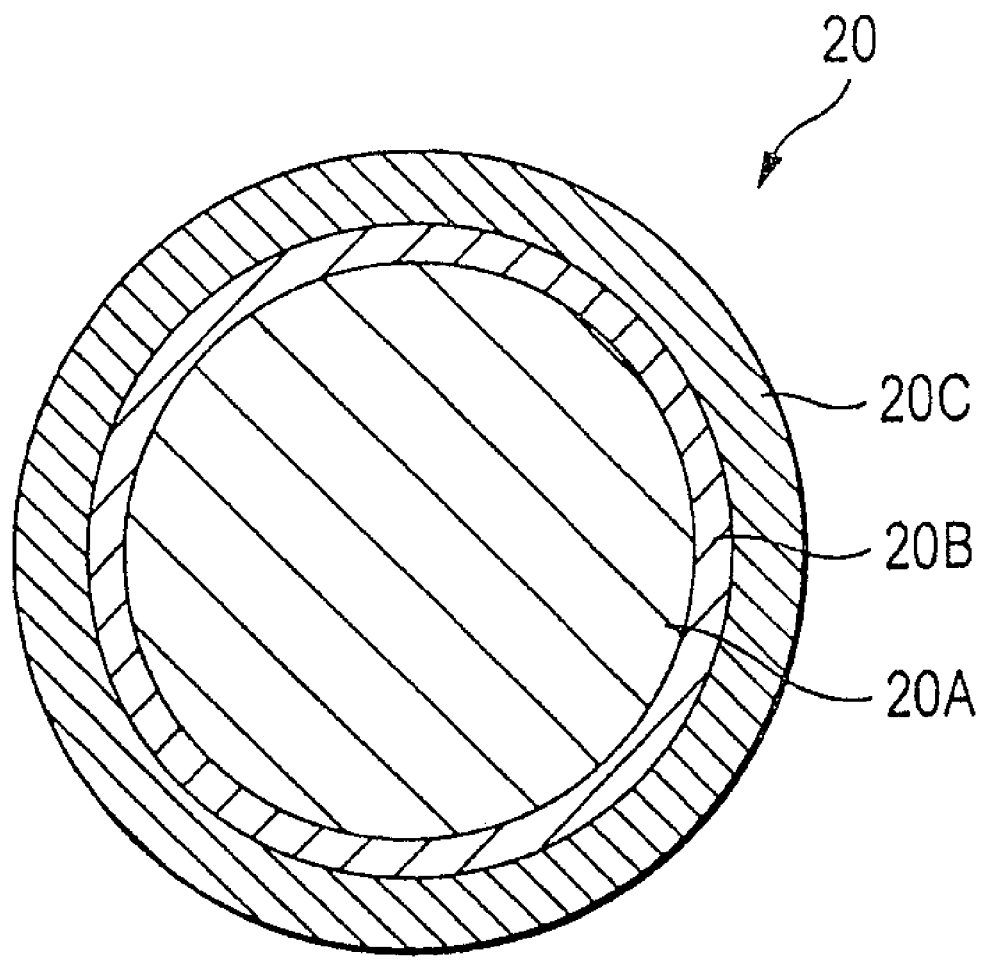
FIG. 2 is a cross-sectional view illustrating an example of the structure of a magnetic solder ball.

The magnetic solder balls 20 are dispersed on the mask 18. The magnetic solder balls 20 is a cored solder ball such as a Cu-cored solder ball or a resin-cored solder ball. As shown in FIG. 2, the magnetic solder balls 20 has a structure in which a solder-diffusion barrier layer 20B and a solder layer 20C are sequentially provided around a core 20A formed of Cu, a resin, or the like. Since the solder-diffusion barrier layer 20 is formed of a ferromagnetic material such as Ni, the solder ball 20 as a whole exhibits a magnetic property.

The magnet 104 in the stage 102 is moved in the direction of arrow M in parallel with the lower surface of the substrate 10 to cause the magnetic solder balls 20 dispersed on the mask 18 to move on the mask 18 by the action of the magnetic force from the magnet 104, thereby dropping the magnetic solder balls 20 into the openings 22 of the mask 18 so as to mount the magnetic solder balls 20 on the bonding pads 16 located below the openings 22. The magnet 104 may be a permanent magnet or an electromagnet.

As the above-described operation is sequentially repeated with respect to the remaining predetermined solder-ball arrangement areas, the solder balls can be arranged on the necessary bonding pads over the entire region of the substrate.

It is thus the magnetic force from the magnet 104 that directly acts on the magnetic solder balls 20 as a dropping means. Since a spatula or a brush is not directly brought into mechanical contact with the solder balls as in the case of the conventional dropping means, damage to, deformation of, and comingling of foreign matter with, the solder balls 20 owing to the dropping means do not occur.

In the first embodiment, in the case where the magnets which are incorporated in the stage are permanent magnets, a vertically moving mechanism may be provided for shielding the magnetic force which is directed in the upward direction.

Second Embodiment

Figure 3A:
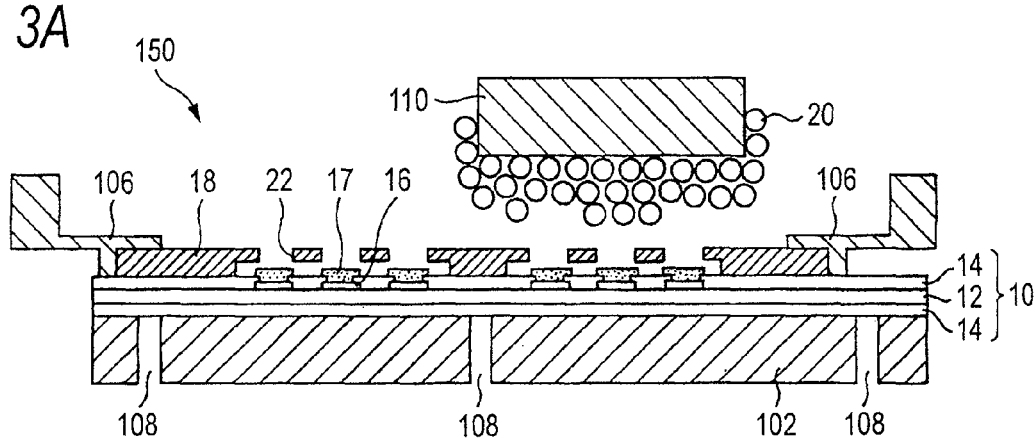
FIGS. 3A to 3C are cross-sectional views illustrating an apparatus and a method for arranging magnetic solder balls in accordance with a second embodiment of the invention.
Figure 3B:
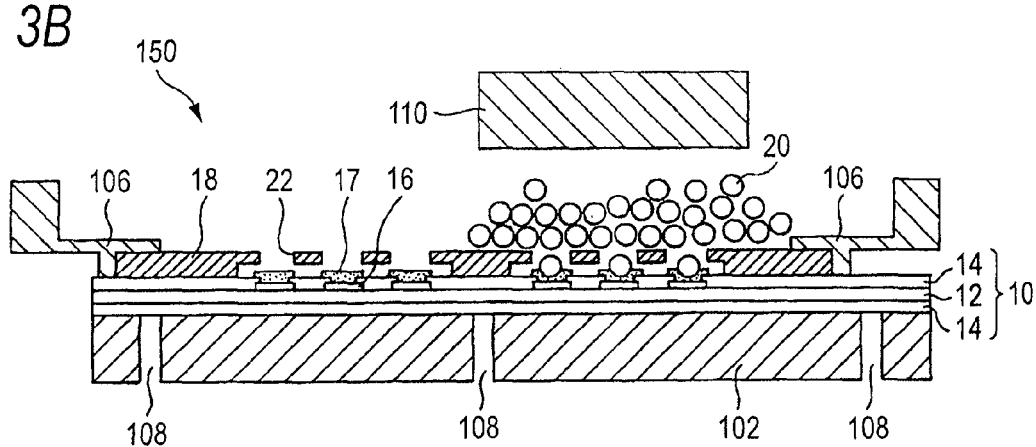
Figure 3C:
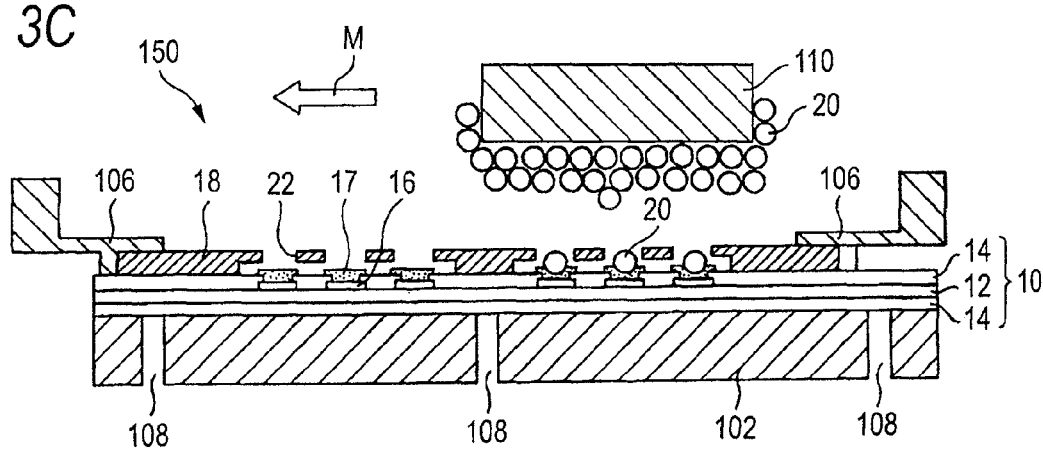

Referring to FIG. 3, a description will be given of the apparatus for arranging magnetic solder balls in accordance with the second invention.

An arranging apparatus 150 is comprised of a stage 102 for placing and fixing the substrate 10 thereon; the mask frame 106 capable of being positioned above the stage 102; and a magnetic head 110 serving as a magnetic generator which is movable above the mask frame 106 and causes a magnetic force to act on the stage 102. The arranging apparatus 150 is an apparatus for arranging the magnetic solder balls 20 one each on each of the plurality of bonding pads 16 on the substrate 10 through the mask 18.

The substrate 10 is a multilayered circuit board in which a wiring layer and an insulating layer are laminated on both surfaces of a resin-made core substrate having through holes and the like by means of the build-up process or the like. The solder resist layer 14 is formed on each of both upper and lower surfaces of the multilayered circuit portion 12, and the multiplicity of bonding pads 16 arranged on the upper surface of the multilayered circuit portion 12 are exposed in the openings of the solder resist layer 14.

It should be noted that although, for the convenience of description, a description will be given of the case where the bonding pads 16 are arranged only on one surface of the substrate 10, in the case where the bonding pads 16 are arranged on both surfaces of the substrate 10 it suffices if each operation described below is similarly carried out for the both surfaces.

A description will be given below of a method of arranging the magnetic solder balls by using the arranging apparatus 150.

As shown in FIG. 3A, the substrate 10 with the adhesive flux 17 coated on the bonding pads 16 is placed and fixed on the stage 102. The stage 102 sucks and fixes the substrate 10 by air suction from the suction ports 108.

The mask frame 106, to which the mask 18 having openings 22 corresponding to the positions of the bonding pads 16 of the substrate 10 is affixed, is disposed and made stationary on the substrate 10 with a predetermined interval provided between the mask 18 and the substrate 10, such that the bonding pads 16 and the openings are positioned with respect to each other.

The magnetic head 110 which attracted the magnetic solder balls 20 by the magnetic force is stopped above a predetermined solder-ball arrangement area of the substrate 10, and the attracting operation of the magnetic head 110 is stopped, as shown in FIG. 3B, so as to disperse the magnetic solder balls 20 on the mask 18, thereby dropping the solder balls 20 into the openings 22 of the mask 18 and mounting the solder balls 20 on the bonding pads 16 located below the openings 22. The magnetic head 110 is a magnetic generator which is capable of starting and stopping the attracting operation, as described above, and typically employs an electromagnet. However, the magnetic head 110 is not necessarily limited to the electromagnet, and it is also possible to adopt a form in which a permanent magnet is used, as shown in FIG. 4.

Figure 4:
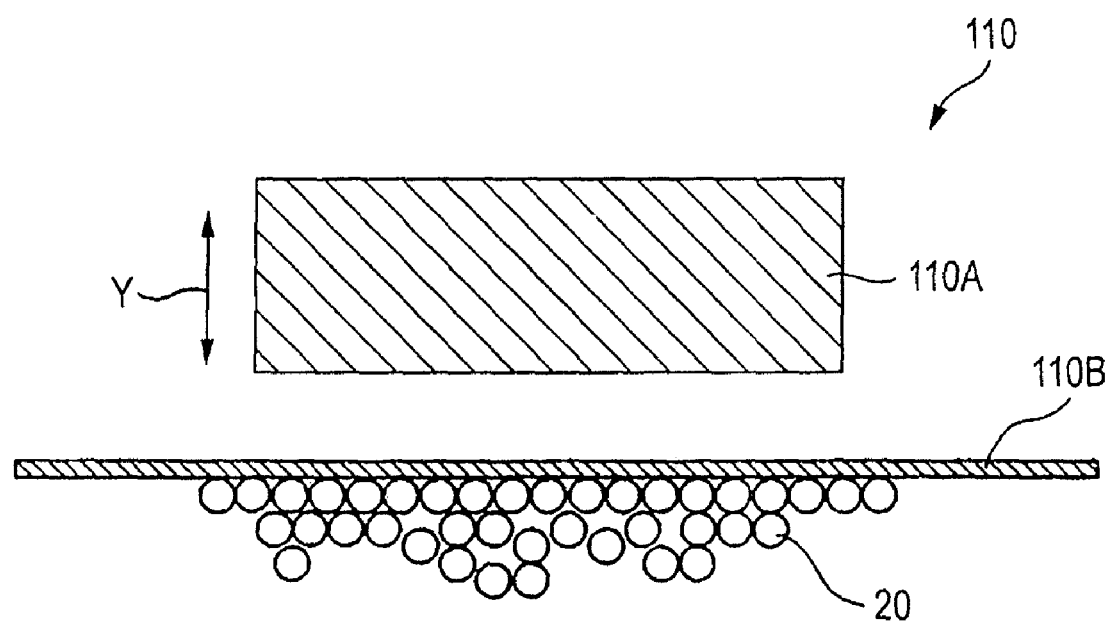
FIG. 4 is a cross-sectional view illustrating another example of a magnetic head in accordance with the second embodiment of the invention.

Namely, the magnetic head 110 shown in FIG. 4 has a permanent magnet 110A and a bulkhead 110B formed of a ferromagnetic material. As the permanent magnet 110A is moved vertically in the direction of arrow Y, it is possible to adjust the interval with the ferromagnetic bulkhead 110B to thereby increase or decrease the magnetization of the ferromagnetic bulkhead 110B and increase or decrease the magnetic force acting in the magnetic solder balls 20, thereby making it possible to start and stop the attracting operation as the magnetic head 110.

After the dropping of the magnetic solder balls 20 is finished, the attracting operation of the magnetic head 110 is resumed, and excess magnetic solder balls 20 on the mask 18 are attracted by the magnetic head 110 and are removed from the mask 18. The magnetic head 110 which is attracting the magnetic solder balls 20 is moved in the direction of the arrow M and is stopped in an ensuing predetermined solder-ball arrangement area, and the operation shown in FIGS. 3A and 3B is repeated.

As the above-described operation is sequentially repeated with respect to the remaining predetermined solder-ball arrangement areas, the solder balls can be arranged on the necessary bonding pads over the entire region of the substrate.

In this embodiment as well, it is the magnetic force from the magnet 104 that directly acts on the magnetic solder balls 20 as the dropping means. Since a spatula or a brush is not directly brought into mechanical contact with the solder balls as in the case of the conventional dropping means, damage to, deformation of, and comingling of foreign matter with, the solder balls 20 owing to the dropping means do not occur.

The magnetic head in accordance with the second embodiment may have a vibrating mechanism for causing the solder balls to drop efficiently.

The bulkhead provided between the magnetic head and the mask in the second embodiment may have the vibrating mechanism.

The magnetic head used in the second embodiment may be used to remove excess solder balls from the dropping device used in the first embodiment.

In the invention, the material of the mask may be a soft magnetic material such as Fe, but may be a resin or the like.

In the invention, as a method of application of the flux, it is possible to use a printing process, a dispensing process, a transfer process, and the like.

According to the invention, an apparatus and a method for arranging magnetic solder balls are provided which make it possible to dispose on bonding pads of a substrate infinitesimally small solder balls, particularly magnetic cored solder balls, without causing damage to, deformation of, and comingling of foreign matter with, the solder balls, which have been unavoidable with the conventional dropping means using such as a spatula or brush.

What is claimed is:

1. A method for arranging magnetic solder balls one on each of a plurality of bonding pads on a substrate through a mask by using an apparatus, for arranging the magnetic solder balls, the apparatus including a stage for placing and fixing the substrate thereon a mask frame ca able of being positioned above the stage, and a magnetic generator which is movable above the mask frame and causes a magnetic force to act on the stage, the method comprising:

placing and fixing on the stage the substrate with adhesive flux coated on the bonding pads;

causing the mask frame, to which the mask having openings corresponding to positions of the bonding pads of the substrate is affixed, to be disposed on the substrate with a predetermined interval provided between the mask and the substrate, such that the bonding pads and the openings are positioned with respect to each other; and causing the magnetic generator which attracts the magnetic solder balls by the magnetic force to be stopped above a predetermined solder-ball arrangement area of the substrate, and stopping the attracting operation of the magnetic generator, so as to disperse the magnetic solder balls on the mask, to drop the solder balls into the openings of the mask so that the solder balls are mounted on the bonding pads located below the openings.

* * * * *